United States Patent
Xiao (10) Patent No.: US 9,437,152 B2
(45) Date of Patent: Sep. 6, 2016

(54) SCAN DRIVING CIRCUIT

(71) Applicant: Shenzhen China Star Optoelectronics Technology Co., Ltd., Shenzhen (CN)

(72) Inventor: Juncheng Xiao, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/416,282

(22) PCT Filed: Dec. 9, 2014

(86) PCT No.: PCT/CN2014/093319
§ 371 (c)(1),
(2) Date: Jan. 24, 2016

(87) PCT Pub. No.: WO2016/074303
PCT Pub. Date: May 19, 2016

(65) Prior Publication Data
US 2016/0189652 A1    Jun. 30, 2016

(30) Foreign Application Priority Data

Nov. 14, 2014    (CN) .......................... 2014 1 0649999

(51) Int. Cl.
*H03B 1/00*    (2006.01)
*G09G 3/36*    (2006.01)
*H03K 17/687*    (2006.01)

(52) U.S. Cl.
CPC ........ *G09G 3/3677* (2013.01); *H03K 17/6871* (2013.01); *G09G 2300/0871* (2013.01); *G09G 2310/0202* (2013.01); *G09G 2310/06* (2013.01)

(58) Field of Classification Search
None
See application file for complete search history.

(56) References Cited

U.S. PATENT DOCUMENTS

| | | | |
|---|---|---|---|
| 7,167,154 B2 * | 1/2007 | Sato ..................... | G09G 3/3677 345/100 |
| 7,515,146 B2 * | 4/2009 | Hayafuji .............. | G09G 3/3266 345/204 |
| 7,545,355 B2 * | 6/2009 | Akimoto .............. | G09G 3/3648 345/87 |
| 2010/0060561 A1 * | 3/2010 | Deane .................. | G09G 3/3677 345/100 |
| 2012/0242630 A1 | 9/2012 | Ohara | |
| 2014/0078028 A1 * | 3/2014 | Qing ..................... | G09G 3/3233 345/77 |
| 2015/0109279 A1 * | 4/2015 | Gupta .................. | G09G 3/3233 345/211 |
| 2015/0279288 A1 | 10/2015 | Dai et al. | |
| 2016/0005372 A1 * | 1/2016 | Yu ........................ | G09G 3/3677 345/208 |

(Continued)

FOREIGN PATENT DOCUMENTS

| CN | 103680453 A | 3/2014 |
|---|---|---|
| CN | 103928007 A | 7/2014 |

(Continued)

*Primary Examiner* — Lincoln Donovan
*Assistant Examiner* — Khareem E Almo
(74) *Attorney, Agent, or Firm* — JMB Davis Ben-David (57) ABSTRACT

A scan driving circuit is provided. The scan driving circuit includes a pull-up control module, a pull-up module, a pull-down module, a pull-down maintenance module, a bootstrap capacitor, and a low-level constant source. The pull-up control module herein is respectively coupled to the pull-up module, the pull-down module, the pull-down maintenance module, and the bootstrap capacitor; the low-level constant source is respectively coupled to the pull-down maintenance module and the pull-down module. The present invention can avoid a leakage phenomenon well and improve reliability of the scan driving circuit.

20 Claims, 8 Drawing Sheets

(56) References Cited

U.S. PATENT DOCUMENTS

| | | | |
|---|---|---|---|
| 2016/0064098 A1* | 3/2016 | Han | G11C 19/28 345/211 |
| 2016/0125828 A1* | 5/2016 | Xiao | G09G 3/3677 345/214 |
| 2016/0125830 A1* | 5/2016 | Xiao | G09G 3/3696 345/92 |
| 2016/0126947 A1* | 5/2016 | Xiao | G09G 3/3648 327/109 |
| 2016/0126948 A1* | 5/2016 | Xiao | H03K 17/6871 327/109 |

FOREIGN PATENT DOCUMENTS

| | | |
|---|---|---|
| CN | 104064150 A | 9/2014 |
| JP | 2008131407 A | 6/2008 |
| WO | 2011080936 A1 | 7/2011 |

* cited by examiner

SCAN DRIVING CIRCUIT

CROSS-REFERENCE TO RELATED APPLICATIONS

This is the U.S. National Stage of International Application No. PCT/CN2014/093319, filed Dec. 9, 2014, which in turn claims the benefit of China Patent Application No. 201410649999.2, filed Nov. 14, 2014.

TECHNICAL FIELD OF THE INVENTION

The present invention relates to a display driving technology, and in particular to a scan driving circuit.

BACKGROUND OF THE INVENTION

Figure 1:
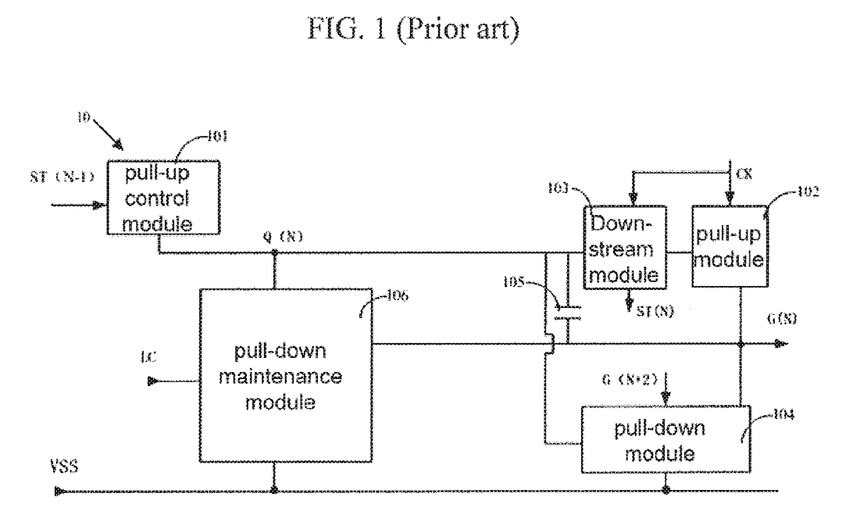
FIG. 1 is a schematic drawing illustrating a conventional scan driving circuit.

Gate Driver On Array, referred to GOA, is a technique to fabricate a scan driving circuit on an array substrate of a conventional thin-film transistor liquid-crystal display, so as to achieve a line-by-line driving manner for scan lines. FIG. 1 is a schematic drawing illustrating a conventional scan driving circuit. As shown in FIG. 1, the scan driving circuit 10 includes a pull-up control module 101, a pull-up module 102, a downstream module 103, a pull-down module 104, a bootstrap capacitor 105, and a pull-down maintenance module 106.

When the scan driving circuit 10 operates at high temperature, a threshold voltage of switches will move to a negative. This leads to the switches of each module of the scan driving circuit 10 being prone to leakage, thus affecting reliability of the scan driving circuit.

Therefore, there is a significant need to provide a scan driving circuit for solving the problem existing in the prior art.

SUMMARY OF THE INVENTION

An objective of the present invention is to provide a scan driving circuit with a lesser leakage phenomenon and higher reliability to overcome the technical problem of the conventional scan driving circuit prone to leakage and thus affecting the reliability of the scan driving circuit.

To achieve the foregoing objective, the technical solution of the present invention is implemented as follows.

An embodiment of the present invention provides a scan driving circuit for driving a plurality of scan lines of cascaded stages. The scan driving circuit includes:

a pull-up control module utilized to receive a scanning signal of a previous stage, and to generate a scan level signal of the corresponding scan line according to the scanning signal of the previous stage;

a pull-up module utilized to lift a scanning signal of a present stage of the corresponding scan line according to the scan level signal and a clock signal of the present stage;

a pull-down module utilized to lower the scan level signal of the corresponding scan line according to a scanning signal of a next stage;

a pull-down maintenance module utilized to maintain a low level of the scan level signal of the corresponding scan line;

a bootstrap capacitor utilized to a high level of the scanning signal of the present stage of the scan line;

a reset module utilized to reset the scan level signal of the present stage of the scan line; and a low-level constant source utilized to provide a pull-down low level;

wherein the pull-up control module is respectively coupled to the pull-up module, the pull-down module, the pull-down maintenance module, and the bootstrap capacitor; the low-level constant source is respectively coupled to the pull-down maintenance module and the pull-down module;

wherein the pull-up control module further comprises a first switch, the scanning signal of the previous stage being input to a control terminal of the first switch, the scanning signal of the previous stage being input to an input terminal the first switch, an output terminal of the first switch respectively coupled to the pull-up module, the pull-down module, the pull-down maintain module, and the bootstrap capacitor.

In the scan driving circuit of the present invention, the pull-up module includes a second switch, a control terminal of the second switch coupled to the output terminal of the first switch of the pull-up control module, the clock signal of the present stage being input to an input terminal of the second switch, an output terminal of the second switch outputting the scanning signal of the present stage.

In the scan driving circuit of the present invention, the pull-down module includes a third switch, the scanning signal of the next stage being input to a control terminal of the third switch, an input terminal of the third switch coupled to the output terminal of the first switch of the pull-up control module, an output terminal of the third switch coupled to the low-level constant source.

In the scan driving circuit of the present invention, the pull-down maintenance module includes a first pull-down maintenance unit, a second pull-down maintenance unit, a thirteenth switch and a fourteenth switch;

a control terminal of the thirteenth switch coupled to the output terminal of the first switch, an output terminal of the thirteenth switch coupled to a reference point K(N), an input terminal of the thirteenth switch coupled to a reference point P(N);

the scanning signal of the previous stage being input to a control terminal of the fourteenth switch, an output terminal of the fourteenth switch coupled to the reference point K(N), an input terminal of the fourteenth switch coupled to the reference point P(N);

the first pull-down maintenance unit comprising a ninth switch, a tenth switch, a sixth switch, an eighth switch, a sixteenth switch;

a control terminal of the tenth switch coupled to the reference point K(N), an input terminal of the tenth switch coupled to the low-level constant source, an output terminal of the tenth switch coupled to the output terminal of the second switch;

a control terminal of the ninth switch coupled to the reference point K(N), an input terminal of the ninth switch coupled to the low-level constant source, an output terminal of the ninth switch coupled to the output terminal of the first switch;

a control terminal of the sixth switch coupled to a first pulse signal, an input terminal of the sixth switch coupled to the first pulse signal, an output terminal of the sixth switch coupled to the reference point K(N);

a control terminal of the sixteenth switch coupled to a second pulse signal, an input terminal of the sixteenth switch coupled to the first pulse signal, an output terminal of the sixteenth switch coupled to the reference point K(N);

a control terminal of the eighth switch coupled to the output terminal of the first switch, an input terminal of the eighth switch coupled to the low-level constant source, an output terminal of the eighth switch coupled to the reference point K(N);

the second pull-down maintenance unit comprising an eleventh switch, a twelfth switch, a fifth switch, a fifteenth switch, and a seventh switch;

a control terminal of the eleventh switch coupled to the reference point P(N), an input terminal of the eleventh switch coupled to the low-level constant source, an output terminal of the eleventh switch coupled to the output terminal of the second switch;

a control terminal of the twelfth switch coupled to the reference point P(N), an input terminal of the twelfth switch coupled to the low-level constant source, an output terminal of the twelfth switch coupled to the output terminal of the first switch;

a control terminal of the fifth switch coupled to the second pulse signal, an input terminal of the fifth switch coupled to the second pulse signal, an output terminal of the fifth switch coupled to the reference point P(N);

a control terminal of the fifteenth switch coupled to the first pulse signal, an input terminal of the fifteenth switch coupled to the second pulse signal, an output terminal of the fifteenth switch coupled to the reference point P(N);

a control terminal of the seventh switch coupled to the output terminal of the first switch, an input terminal of the seventh switch coupled to the low-level constant source, an output terminal of the seventh switch coupled to the reference point K(N).

In the scan driving circuit of the present invention, an electric potential of the first pulse signal is opposite to that of the second pulse signal.

In the scan driving circuit of the present invention, the first pull-down maintain further includes an eighteenth switch, the scanning signal of the previous stage being input to a control terminal of the eighteenth switch, an input terminal of the eighteenth switch coupled to the low-level constant source, an output terminal of the eighteenth switch coupled to the reference point K(N);

the second pull-down maintain further comprises an seventeenth switch, the scanning signal of the previous stage being input to a control terminal of the seventeenth switch, an input terminal of the seventeenth switch coupled to the low-level constant source, an output terminal of the seventeenth switch coupled to the reference point P(N).

In the scan driving circuit of the present invention, the first pull-down maintain further includes an eighteenth switch, the scanning signal of the previous stage being input to a control terminal of the eighteenth switch, an input terminal of the eighteenth switch coupled to the low-level constant source, an output terminal of the eighteenth switch coupled to the first pulse signal;

the second pull-down maintain further includes an seventeenth switch, the scanning signal of the previous stage being input to a control terminal of the seventeenth switch, an input terminal of the seventeenth switch coupled to the low-level constant source, an output terminal of the seventeenth switch coupled to the second pulse signal.

In the scan driving circuit of the present invention, the first pull-down maintain further comprises a twentieth switch, a control terminal of the twentieth switch coupled to the reference point K(N), an input terminal of the twentieth switch coupled to the reference point K(N), an output terminal of the twentieth switch coupled to the first pulse signal;

the second pull-down maintain further comprises a nineteenth switch, a control terminal of the nineteenth switch coupled to the reference point K(N), an input terminal of the nineteenth switch coupled to the reference point K(N), an output terminal of the nineteenth switch coupled to the second pulse signal. In the scan driving circuit of the present invention, the first pulse signal and the second pulse signal are high-frequency pulse signals or low-frequency potential signals.

An embodiment of the present invention further provides a scan driving circuit for driving a plurality of scan lines of cascaded stages. It includes:

a pull-up control module utilized to receive a scanning signal of a previous stage, and to generate a scan level signal of the corresponding scan line according to the scanning signal of the previous stage;

a pull-up module utilized to lift a scanning signal of a present stage of the corresponding scan line according to the scan level signal and a clock signal of the present stage;

a pull-down module utilized to lower the scan level signal of the corresponding scan line according to a scanning signal of a next stage;

a pull-down maintenance module utilized to maintain a low level of the scan level signal of the corresponding scan line;

a bootstrap capacitor utilized to a high level of the scanning signal of the present stage of the scan line; and a low-level constant source utilized to provide a pull-down low level;

wherein the pull-up control module is respectively coupled to the pull-up module, the pull-down module, the pull-down maintenance module, and the bootstrap capacitor; the low-level constant source is respectively coupled to the pull-down maintenance module and the pull-down module.

In the scan driving circuit of the present invention, the pull-up control module further includes a first switch, the scanning signal of the previous stage being input to a control terminal of the first switch, the scanning signal of the previous stage being input to an input terminal the first switch, an output terminal of the first switch respectively coupled to the pull-up module, the pull-down module, the pull-down maintain module, and the bootstrap capacitor.

In the scan driving circuit of the present invention, the pull-up module includes a second switch, a control terminal of the second switch coupled to the output terminal of the first switch of the pull-up control module, the clock signal of the present stage being input to an input terminal of the second switch, an output terminal of the second switch outputting the scanning signal of the present stage.

In the scan driving circuit of the present invention, the pull-down module comprises a third switch, the scanning signal of the next stage being input to a control terminal of the third switch, an input terminal of the third switch coupled to the output terminal of the first switch of the pull-up control module, an output terminal of the third switch coupled to the low-level constant source.

In the scan driving circuit of the present invention, the pull-down maintenance module includes a first pull-down maintenance unit, a second pull-down maintenance unit, a thirteenth switch and a fourteenth switch;

a control terminal of the thirteenth switch coupled to the output terminal of the first switch, an output terminal of the thirteenth switch coupled to a reference point K(N), an input terminal of the thirteenth switch coupled to a reference point P(N);

the scanning signal of the previous stage being input to a control terminal of the fourteenth switch, an output terminal of the fourteenth switch coupled to the reference point K(N), an input terminal of the fourteenth switch coupled to the reference point P(N);

the first pull-down maintenance unit comprising a ninth switch, a tenth switch, a sixth switch, an eighth switch, a sixteenth switch;

a control terminal of the tenth switch coupled to the reference point K(N), an input terminal of the tenth switch coupled to the low-level constant source, an output terminal of the tenth switch coupled to the output terminal of the second switch;

a control terminal of the ninth switch coupled to the reference point K(N), an input terminal of the ninth switch coupled to the low-level constant source, an output terminal of the ninth switch coupled to the output terminal of the first switch;

a control terminal of the sixth switch coupled to a first pulse signal, an input terminal of the sixth switch coupled to the first pulse signal, an output terminal of the sixth switch coupled to the reference point K(N);

a control terminal of the sixteenth switch coupled to a second pulse signal, an input terminal of the sixteenth switch coupled to the first pulse signal, an output terminal of the sixteenth switch coupled to the reference point K(N);

a control terminal of the eighth switch coupled to the output terminal of the first switch, an input terminal of the eighth switch coupled to the low-level constant source, an output terminal of the eighth switch coupled to the reference point K(N);

the second pull-down maintenance unit comprising an eleventh switch, a twelfth switch, a fifth switch, a fifteenth switch, and a seventh switch;

a control terminal of the eleventh switch coupled to the reference point P(N), an input terminal of the eleventh switch coupled to the low-level constant source, an output terminal of the eleventh switch coupled to the output terminal of the second switch;

a control terminal of the twelfth switch coupled to the reference point P(N), an input terminal of the twelfth switch coupled to the low-level constant source, an output terminal of the twelfth switch coupled to the output terminal of the first switch;

a control terminal of the fifth switch coupled to the second pulse signal, an input terminal of the fifth switch coupled to the second pulse signal, an output terminal of the fifth switch coupled to the reference point P(N);

a control terminal of the fifteenth switch coupled to the first pulse signal, an input terminal of the fifteenth switch coupled to the second pulse signal, an output terminal of the fifteenth switch coupled to the reference point P(N);

a control terminal of the seventh switch coupled to the output terminal of the first switch, an input terminal of the seventh switch coupled to the low-level constant source, an output terminal of the seventh switch coupled to the reference point K(N).

In the scan driving circuit of the present invention, an electric potential of the first pulse signal is opposite to that of the second pulse signal.

In the scan driving circuit of the present invention, the first pull-down maintain further includes an eighteenth switch, the scanning signal of the previous stage being input to a control terminal of the eighteenth switch, an input terminal of the eighteenth switch coupled to the low-level constant source, an output terminal of the eighteenth switch coupled to the reference point K(N);

the second pull-down maintain further includes an seventeenth switch, the scanning signal of the previous stage being input to a control terminal of the seventeenth switch, an input terminal of the seventeenth switch coupled to the low-level constant source, an output terminal of the seventeenth switch coupled to the reference point P(N).

In the scan driving circuit of the present invention, the first pull-down maintain further includes an eighteenth switch, the scanning signal of the previous stage being input to a control terminal of the eighteenth switch, an input terminal of the eighteenth switch coupled to the low-level constant source, an output terminal of the eighteenth switch coupled to the first pulse signal;

the second pull-down maintain further comprises an seventeenth switch, the scanning signal of the previous stage being input to a control terminal of the seventeenth switch, an input terminal of the seventeenth switch coupled to the low-level constant source, an output terminal of the seventeenth switch coupled to the second pulse signal.

In the scan driving circuit of the present invention, the first pull-down maintain further includes a twentieth switch, a control terminal of the twentieth switch coupled to the reference point K(N), an input terminal of the twentieth switch coupled to the reference point K(N), an output terminal of the twentieth switch coupled to the first pulse signal;

the second pull-down maintain further includes a nineteenth switch, a control terminal of the nineteenth switch coupled to the reference point K(N), an input terminal of the nineteenth switch coupled to the reference point K(N), an output terminal of the nineteenth switch coupled to the second pulse signal.

In the scan driving circuit of the present invention, the first pulse signal and the second pulse signal are high-frequency pulse signals or low-frequency potential signals.

In the scan driving circuit of the present invention, the scan driving circuit further includes:

a reset module utilized to reset the scan level signal of the present stage of the scan line.

In comparison with the prior art scan driving circuit, the scan driving circuit of the present invention, by disposing the pull-up control module, can avoid the leakage phenomenon well and improve the reliability of the scan driving circuit, thus solving the technical problem of the conventional scan driving circuit prone to leakage and thus affecting the reliability of the scan driving circuit.

It is to be understood that both the foregoing general description and the following detailed description of the present invention are exemplary and explanatory and are intended to provide further explanation of the invention as claimed.

DETAILED DESCRIPTION OF THE INVENTION

Descriptions of the following embodiments refer to attached drawings which are utilized to exemplify specific embodiments. Directional terms mentioned in the present invention, such as "top" and "down", "front", "rear", "left", "right", "inside", "outside", "side" and so on are only directions with respect to the attached drawings. Therefore, used directional terms are utilized to explain and understand the present invention but not to limit the present invention.

In different drawings, the same reference numerals refer to like parts throughout the drawings.

Figure 2:
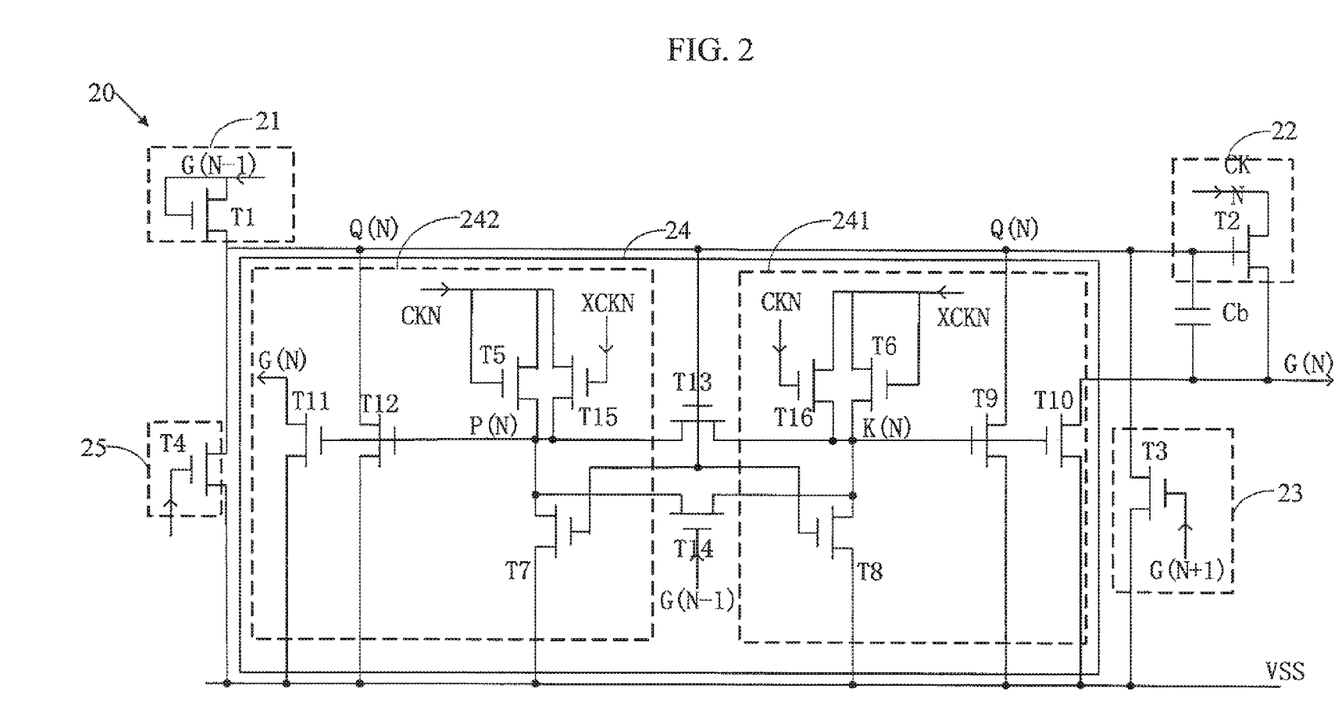
FIG. 2 is a schematic drawing illustrating a scan driving circuit according to a first preferred embodiment of the present invention.
Figure 3:
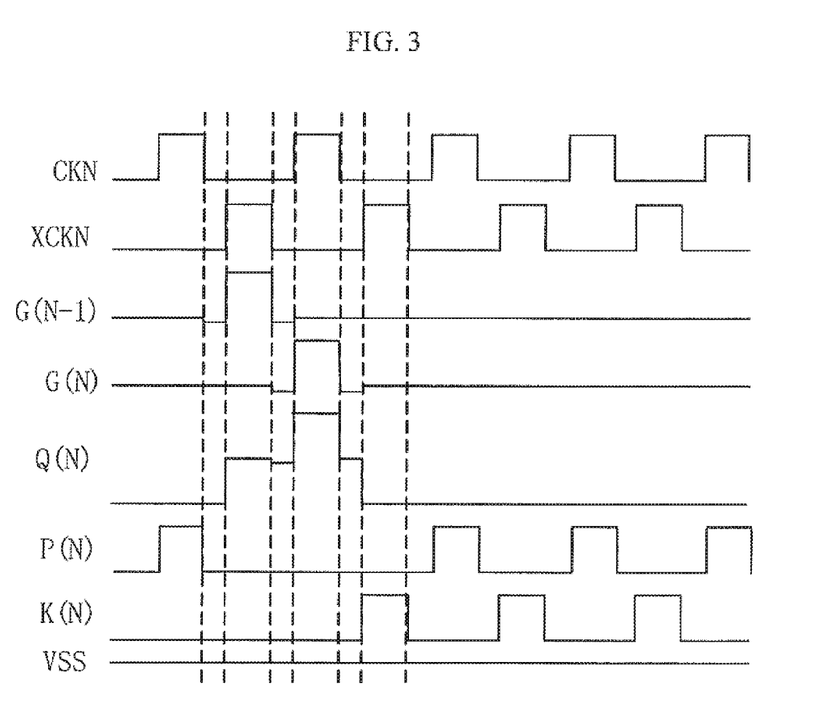
FIG. 3 is a schematic drawing illustrating signal waveforms of the scan driving circuit according to the first preferred embodiment of the present invention.

Referring to FIG. 2 and FIG. 3, FIG. 2 is a schematic drawing illustrating a scan driving circuit according to a first preferred embodiment of the present invention, FIG. 3 is a schematic drawing illustrating signal waveforms of the scan driving circuit according to the first preferred embodiment of the present invention. The scan driving circuit 20 of the preferred embodiment includes a pull-up control module 21, a pull-up module 22, a pull-down module 23, a pull-down maintenance module 24, a bootstrap capacitor Cb, and a low-level constant source VSS. The pull-up control module 21 is utilized to receive a scanning signal G(N−1) of a previous stage, and to generate a scan level signal Q(N) of a corresponding scan line according to the scanning signal G(N−1) of the previous stage. The pull-up module 22 is utilized to lift a scanning signal G(N) of a present stage of the corresponding scan line according to the scan level signal Q(N) and a clock signal CK(N) (equal to the following second pulse signal CKN) of the present stage. The pull-down module 23 is utilized to lower the scan level signal Q(N) of the corresponding scan line according to a scanning signal G(N+1) of a next stage. The pull-down maintenance module 24 is utilized to maintain a low level of the scan level signal Q(N) of the corresponding scan line. The bootstrap capacitor Cb is disposed between an output terminal of a first switch T1 and an output terminal of a second switch T2, and is utilized to generate a high level of the scanning signal G(N) of the present stage of the scan line. The low-level constant source VSS is utilized to provide a pull-down low level.

The pull-up control module 21 herein is respectively coupled to the pull-up module 22, the pull-down module 23, the pull-down maintain module 24, and the bootstrap capacitor Cb; the low-level constant source VSS is respectively coupled to the pull-down maintain module 24 and the pull-down module 23.

The pull-up control module 21 includes a first switch T1, and the scanning signal G(N−1) of the previous stage is input to a control terminal of the first switch T1; the scanning signal G(N−1) of the previous stage is input to an input terminal of the first switch T1; the output terminal of the first switch T1 is respectively coupled to the pull-up module 22, the pull-down module 23, the pull-down maintain module 24, and the bootstrap capacitor Cb.

The pull-up module 22 includes a second switch T2, and a control terminal of the second switch T2 is coupled to the output terminal of the first switch T1 of the pull-up control module 21; the clock signal CK(N) of the present stage is input to an input terminal of the second switch T2; an output terminal of the second switch T2 outputs the scanning signal G(N) of the present stage.

The pull-down module includes a third switch T3, and the scanning signal G(N+1) of the next stage is input to a control terminal of the third switch T3; an input terminal of the third switch T3 is coupled to the output terminal of the first switch T1 of the pull-up control module 21; an output terminal of the third switch T3 is coupled to the low-level constant source VSS.

The pull-down maintenance module 24 includes a first pull-down maintenance unit 241, a second pull-down maintenance unit 242, a thirteenth switch T13, and a fourteenth switch T14.

A control terminal of the thirteenth switch T13 is coupled to the output terminal of the first switch T1; an output terminal of the thirteenth switch T13 is coupled to a reference point K(N); an input terminal of the thirteenth switch T13 is coupled to a reference point P(N).

The scanning signal G(N−1) of the previous stage is input to a control terminal of the fourteenth switch T14; an output terminal of the fourteenth switch T14 is coupled to the reference point K(N); an input terminal of the fourteenth switch T14 is coupled to the reference point P(N).

The first pull-down maintenance unit 214 includes a ninth switch T9, a tenth switch T10, a sixth switch T6, an eighth switch T8, a sixteenth switch T16.

A control terminal of the tenth switch T10 is coupled to the reference point K(N); an input terminal of the tenth switch T10 is coupled to the low-level constant source VSS; an output terminal of the tenth switch T10 is coupled to the output terminal of the second switch T2.

A control terminal of the ninth switch T9 is coupled to the reference point K(N); an input terminal of the ninth switch T9 is coupled to the low-level constant source VSS; an output terminal of the ninth switch T9 is coupled to the output terminal of the first switch T1.

A control terminal of the sixth switch T6 is coupled to a first pulse signal XCKN (i.e. clock signal); an input terminal of the sixth switch T6 is coupled to the first pulse signal XCKN, an output terminal of the sixth switch T6 is coupled to the reference point K(N).

A control terminal of the sixteenth switch T16 is coupled to a second pulse signal CKN (i.e. a clock signal opposite to XCKN); an input terminal of the sixteenth switch T16 is coupled to the first pulse signal XCKN; an output terminal of the sixteenth switch T16 is coupled to the reference point K(N).

A control terminal of the eighth switch T8 is coupled to the output terminal of the first switch T1; an input terminal of the eighth switch T8 is coupled to the low-level constant source VSS; an output terminal of the eighth switch T8 is coupled to the reference point K(N).

The second pull-down maintenance unit 242 includes an eleventh switch T11, a twelfth switch T12, a fifth switch T5, a seventh switch T7, and a fifteenth switch T15.

A control terminal of the eleventh switch T11 is coupled to the reference point P(N); an input terminal of the eleventh switch T11 is coupled to the low-level constant source VSS; an output terminal of the eleventh switch T11 is coupled to the output terminal of the second switch T2.

A control terminal of the twelfth switch T12 is coupled to the reference point P(N); an input terminal of the twelfth switch T12 is coupled to the low-level constant source VSS; an output terminal of the twelfth switch T12 is coupled to the output terminal of the first switch T1.

A control terminal of the fifth switch T5 is coupled to the second pulse signal CKN; an input terminal of the fifth switch T5 is coupled to the second pulse signal CKN; an output terminal of the fifth switch T5 is coupled to the reference point P(N).

A control terminal of the fifteenth switch T15 is coupled to the first pulse signal XCKN; an input terminal of the fifteenth switch T15 is coupled to the second pulse signal CKN; an output terminal of the fifteenth switch T15 is coupled to the reference point P(N).

A control terminal of the seventh switch T7 is coupled to the output terminal of the first switch T1; an input terminal of the seventh switch T7 is coupled to the low-level constant source VSS; an output terminal of the seventh switch T7 is coupled to the reference point P(N).

An electric potential of the first pulse signal XCKN herein is opposite to that of the second pulse signal CKN. A duty cycle of the first pulse signal XCKN and the second pulse signal CKN is about 0.5.

Preferably, the scan driving circuit 20 of the preferred embodiment can further include a reset module 25 which is utilized to reset the scan level signal Q(N) of the present stage of the scan line. The reset module 25 includes a switch T4, and performs the reset for the scan level signal Q(N) of the scan line by inputting a high scan level signal to a control terminal of the switch T4.

Referring to FIG. 2 and FIG. 3, in using the scan driving circuit 20 of the preferred embodiment, when the scanning signal G(N−1) of the previous stage is at a high level, the first switch T1 is turned on. The bootstrap capacitor Cb is charged by the scanning signal G(N−1) of the previous stage through the first switch T1, such that the reference point Q (N) rises to a higher level. Then the scanning signal G(N−1) of the previous stage is converted to a low level, and the first switch T1 is turned off. The reference point Q (N) maintains a high level by the bootstrap capacitor Cb, and the second switch T2.

Subsequently, the scanning signal CK(N) of the present stage is converted to a high level, and the bootstrap capacitor Cb continues to be charged by the clock signal CK(N) through the second switch T2, such that the reference point Q (N) reaches to a higher level, and the scanning signal G(N) of the present stage is also converted to the high level.

Meanwhile, since the thirteenth switch T13 is turned on, a scanning control signal Q(N) with a high level is input to the control terminals of the seventh switch T7 and the eighth switch T8, whereby the seventh switch T7 and the eighth switch T8 are turned on. The reference point P(N) and the reference point K(N) keep the low level under the control of the low-level constant source VSS. Meanwhile, the ninth switch T9, the tenth switch T10, the eleventh switch T11 and the twelfth switch T12 keep the turn-off, thus ensuring the high level of the scanning control signal Q(N).

When the scanning signal G(N+1) of the next stage is converted to the high level, the third switch T3 is turned on, and the reference point Q(N), i.e. the scanning control signal Q(N) is pulled to the low level by the low-level constant source VSS. Under this condition, the thirteenth switch T13 and the second switch T2 are turned off. The first pull-down maintenance unit 241 or the second pull-down maintenance unit 242 keeps the low level of the reference point Q(N) under the first pulse signal XCKN and the second pulse signal CKN.

When the first high-frequency pulse signal XCKN is at the high level, and the second high-frequency pulse signal CKN is at the low level, the fifteenth switch T15 and the sixth switch T6 are turned on. The reference point K(N) is pulled to the high level through the sixth switch T6, and the reference point P(N) keeps the pulled low level. Accordingly, the ninth switch T9 and the tenth switch T10 are turned on, and the reference point Q(N) is coupled to the low-level constant source VSS via the ninth switch T9 of the first pull-down maintain unit 241, thereby keeping the low level of the reference point Q(N). The scanning signal G (N) of the present stage is coupled to the low-level constant source VSS via the tenth switch T10 of the first pull-down maintenance unit 241, thereby keeping the low level of the scanning signal G (N) of the present stage.

When the first high-frequency pulse signal XCKN is at the low level, and the second high-frequency pulse signal CKN is at the high level, the fifth switch T5 and the sixteenth switch T16 are turned on. The reference point P(N) is pulled to the high level through the fifth switch T5, and the reference point K(N) keeps the pulled low level. Accordingly, the eleventh switch T11 and the twelfth switch T12 are turned on, and the reference point P(N) is coupled to the low-level constant source VSS via the twelfth switch T12 of the second pull-down maintain unit 242, thereby keeping the low level of the reference point Q(N). the scanning signal G(N) of the present stage is coupled to the low-level constant source VSS via the eleventh switch T11 of the second pull-down maintain unit 242, thereby keeping the low level of the scanning signal G(N) of the present stage.

In summary, the pull-down maintain unit 24 of the scan driving circuit 20 of the preferred embodiment can maintain the high electric potential of the reference point Q(N) well by turning off the ninth switch T9, the tenth switch T10, the eleventh switch T11, and the twelfth switch T12 under the reference point Q(N) at the high electric potential. Furthermore, it can maintain the low electric potentials of the reference point Q(N) and the scanning signal G(N) of the present stage by the successive actions of the first pull-down maintain unit 241 and the second pull-down maintain unit 242 under the reference point Q(N) at the low electric potential.

The scan driving circuit of the present invention can avoid the leakage phenomenon well and improve the reliability of the scan driving circuit by disposing the pull-up control module.

Figure 4:
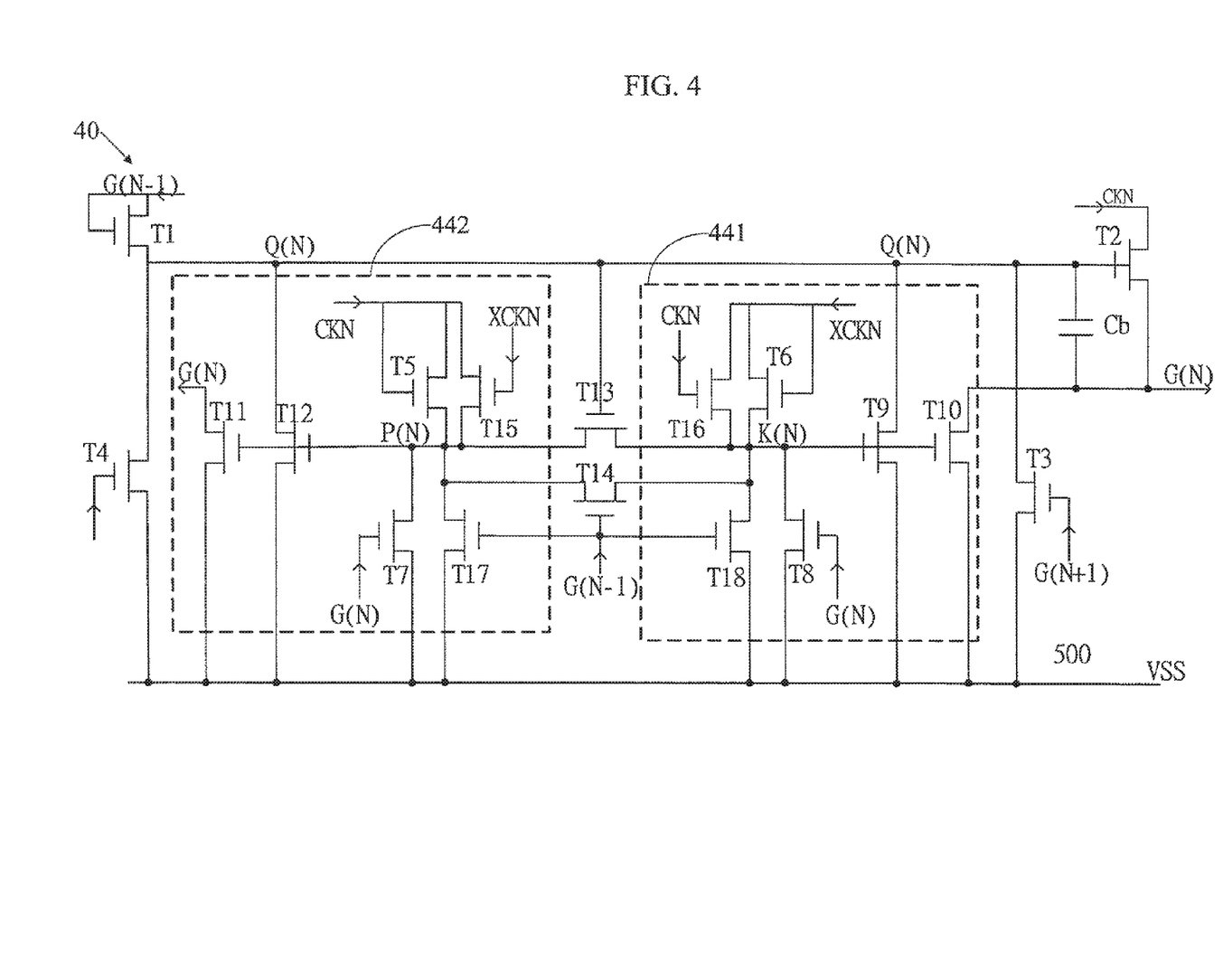
FIG. 4 is a schematic drawing illustrating a scan driving circuit according to a second preferred embodiment of the present invention.

Referring to FIG. 4, FIG. 4 is a schematic drawing illustrating a scan driving circuit according to a second preferred embodiment of the present invention. On the basis of the first preferred embodiment, the first pull-down maintenance unit 441 of the scan driving circuit 40 of the preferred embodiment further includes an eighteenth switch T18. The scanning signal G(N−1) of the previous stage is input to a control terminal of the eighteenth switch T18; an input terminal of the eighteenth switch T18 is coupled to the low-level constant source VSS; an output terminal of the eighteenth switch T18 is coupled to the reference point K(N). The second pull-down maintenance unit 442 of the scan driving circuit 40 of the preferred embodiment further includes a seventeenth switch T17. The scanning signal G(N−1) of the previous stage is input to a control terminal of the seventeenth switch T17; an input terminal of the seventeenth switch T17 is coupled to the low-level constant source VSS; an output terminal of the seventeenth switch T17 is coupled to the reference point P(N).

Since all of the seventh switch T7, the eighth switch T8, the seventeenth switch T17, and the eighteenth switch T18 are not coupled to the reference point Q(N), a RC impedance of the reference point Q(N) can be better reduced. Meanwhile, by the seventh switch T7 and the seventeenth switch T17, the electric potential of the reference point P(N), as well as by the eighth switch T8 and the eighteenth switch T18, the electric potential of the reference point K(N) can carry out a better pull-down.

Figure 5:
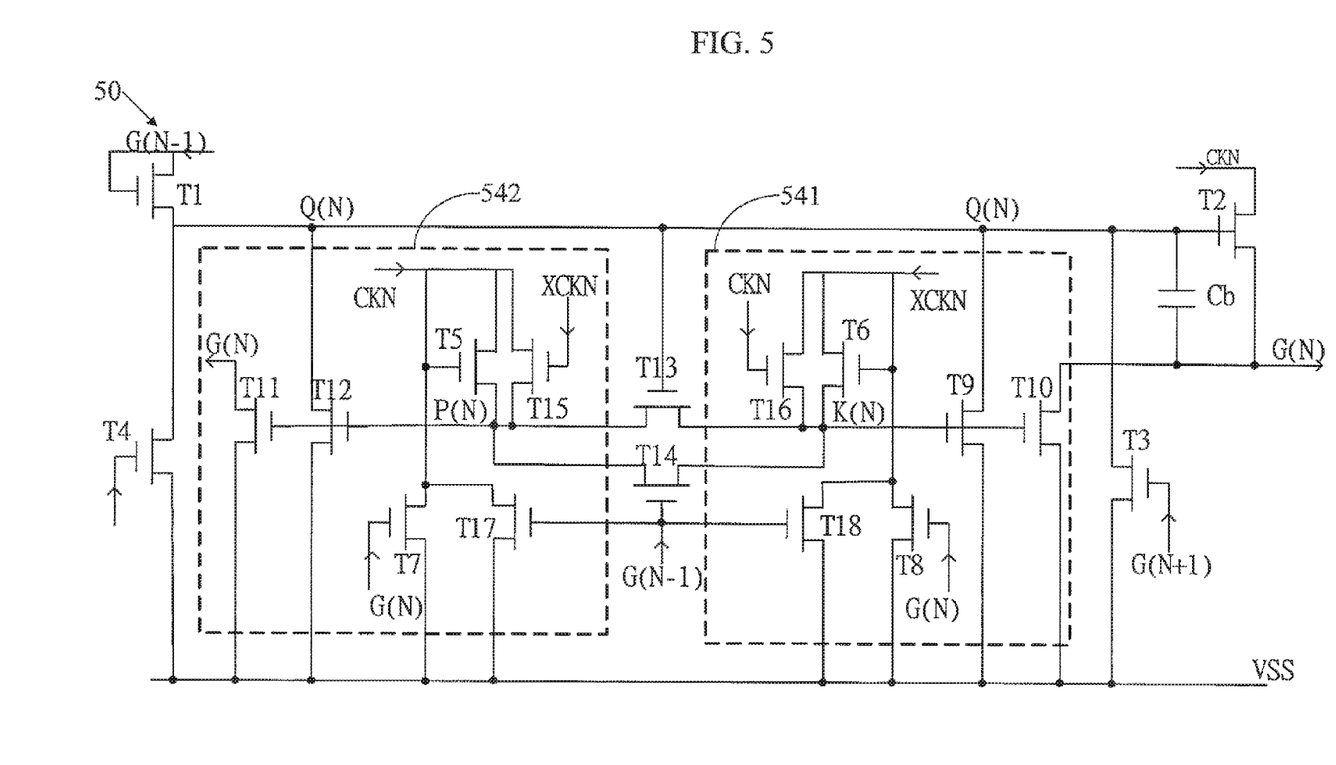
FIG. 5 is a schematic drawing illustrating a scan driving circuit according to a third preferred embodiment of the present invention.

Referring to FIG. 5, FIG. 5 is a schematic drawing illustrating a scan driving circuit according to a third preferred embodiment of the present invention. On the basis of the first preferred embodiment, the first pull-down maintenance unit 541 of the scan driving circuit 50 of the preferred embodiment further includes the eighteenth switch T18. The scanning signal G(N-1) of the previous stage is input to the control terminal of the eighteenth switch T18; the input terminal of the eighteenth switch T18 is coupled to the low-level constant source VSS; the output terminal of the eighteenth switch T18 is coupled to the first high-frequency pulse signal XCKN. The second pull-down maintenance unit 542 of the scan driving circuit 50 of the preferred embodiment further includes the seventeenth switch T17. The scanning signal G(N-1) of the previous stage is input to the control terminal of the seventeenth switch T17; the input terminal of the seventeenth switch T17 is coupled to the low-level constant source VSS; the output terminal of the seventeenth switch T17 is coupled to the second high-frequency pulse signal CKN.

When the seventh switch T7, the eighth switch T8, the seventeenth switch T17, and the eighteenth switch T18 in the preferred embodiment are turned on, the first high-frequency pulse signal XCKN and the second high-frequency pulse signal CKN can be pulled down, so that the electric potentials of the reference point P(N) and the reference point K(N) can carry out a better pull-down when the scanning signal G(N) of the present stage reaches the high level.

Figure 6:
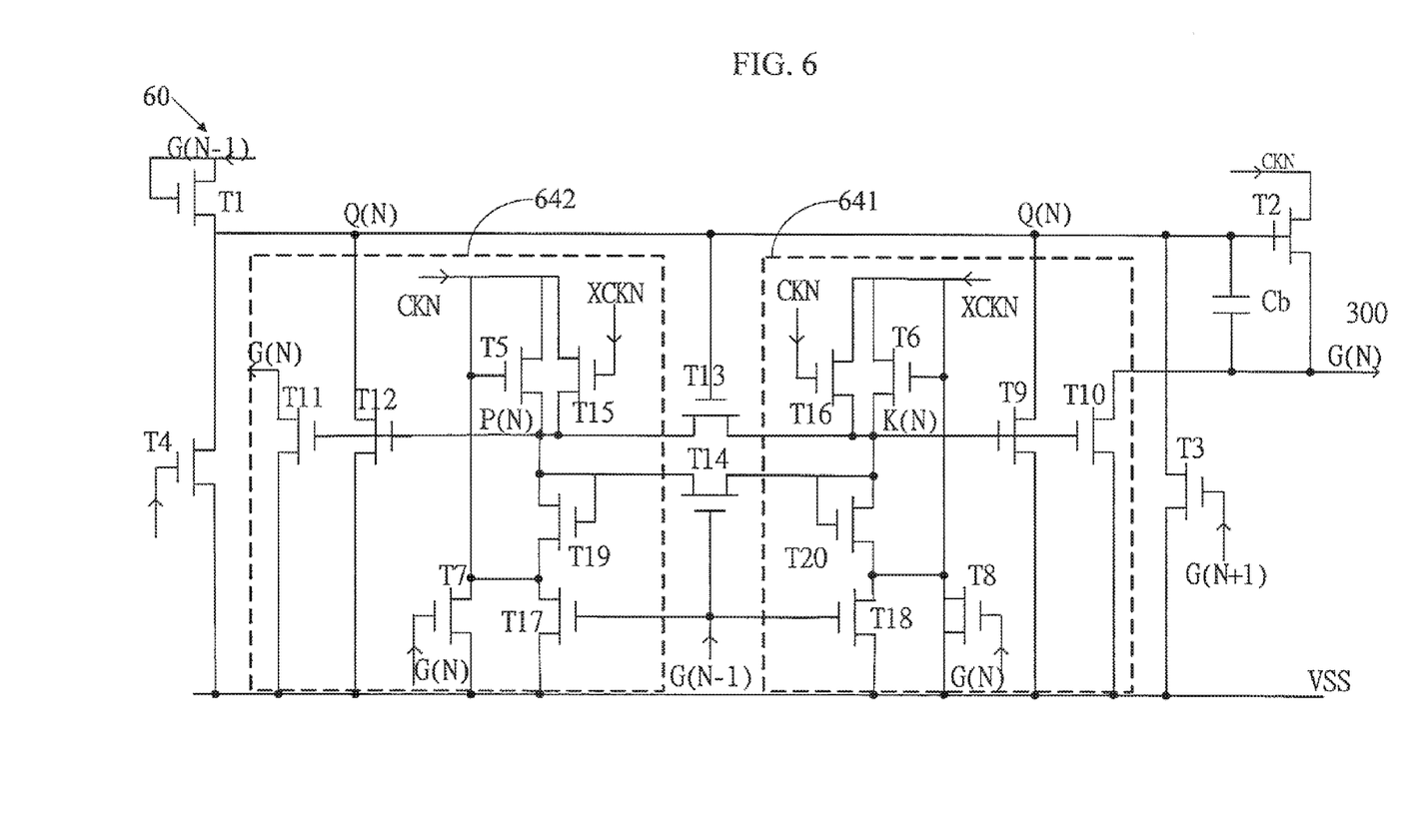
FIG. 6 is a schematic drawing illustrating a scan driving circuit according to a fourth preferred embodiment of the present invention.

Referring to FIG. 6, FIG. 6 is a schematic drawing illustrating a scan driving circuit according to a fourth preferred embodiment of the present invention. On the basis of the third preferred embodiment, the first pull-down maintenance unit 641 of the scan driving circuit 60 of the preferred embodiment further includes a twentieth switch T20. A control terminal of the twentieth switch T20 is coupled to the reference point K(N); an input terminal of the twentieth switch T20 is coupled to the reference point K(N); the output terminal of the twentieth switch T20 is coupled to the first high-frequency pulse signal XCKN. The second pull-down maintenance unit 642 further includes a nineteenth switch T19. A control terminal of the nineteenth switch T19 is coupled to the reference point K(N); the output terminal of the nineteenth switch T19 is coupled to the second high-frequency pulse signal CKN.

Based on the disposal of the nineteenth switch T19 and the twentieth switch T20, even if one or more switches in the fifth switch T5, the sixth switch T6, the fifteenth switch T15, and the sixteenth switch T16 fail, it also can ensure that the electric potentials of the reference point P(N) and the reference point K(N) are pulled down when the scanning signal G(N-1) of the previous stage is at high level, thus ensuring the high electric potential of the reference point Q(N).

Figure 7:
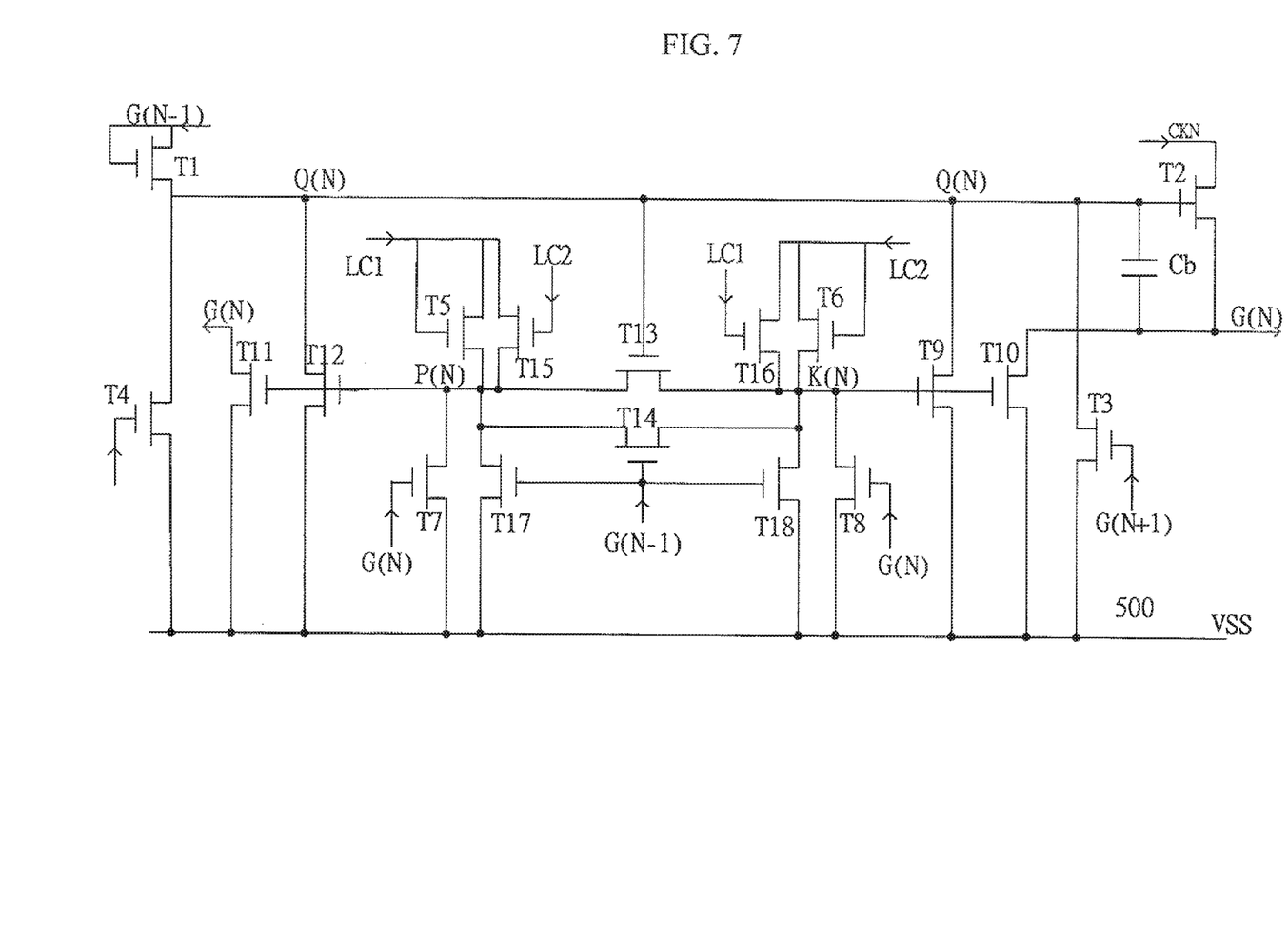
FIG. 7 is a schematic drawing illustrating a scan driving circuit according to a fifth preferred embodiment of the present invention.
Figure 8:
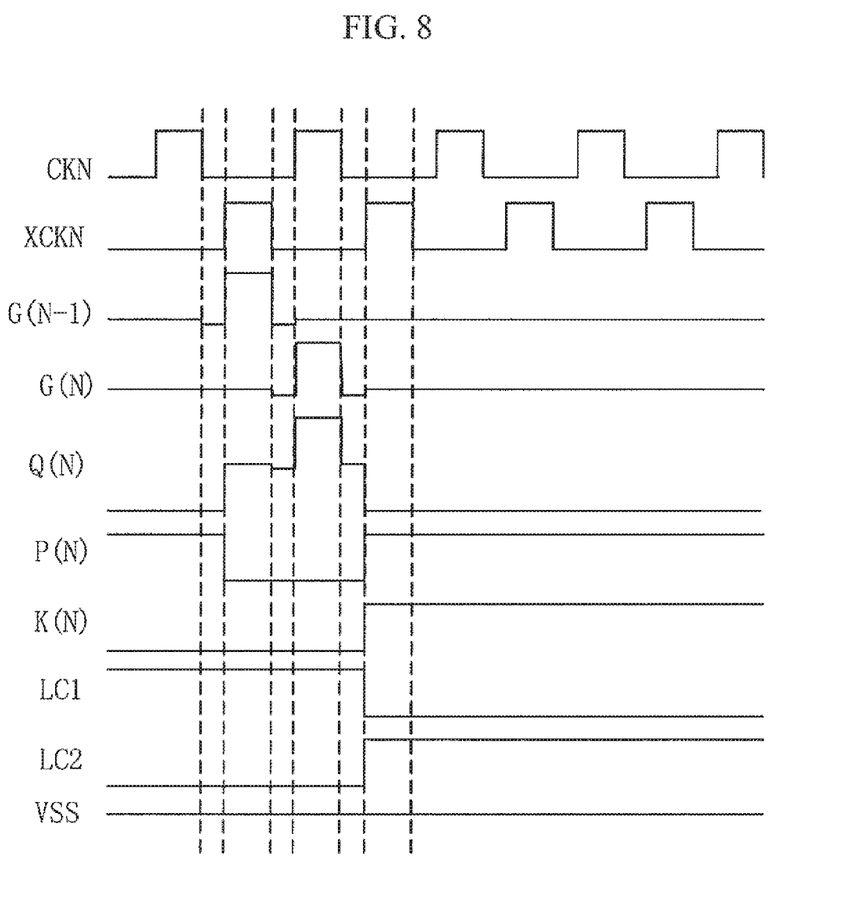
FIG. 8 is a schematic drawing illustrating signal waveforms of the scan driving circuit according to the fifth preferred embodiment of the present invention.

Referring to FIG. 7 and FIG. 8, FIG. 7 is a schematic drawing illustrating a scan driving circuit according to a fifth preferred embodiment of the present invention; FIG. 8 is a schematic drawing illustrating signal waveforms of the scan driving circuit according to the fifth preferred embodiment of the present invention. The difference between the preferred embodiment and the second preferred embodiment of the scan driving circuit is that the first high-frequency pulse signal XCKN is replaced by a first low-frequency potential signal LC2, and the second high-frequency pulse signal CKN is replaced by a second low-frequency potential signal LC1. The first low-frequency potential signal LC2 and the second low-frequency potential signal LC1 can convert the electric potentials after a number of frames or dozens of frames. This can reduce the pulse switching of the scan driving circuit and save the power consumption of the scan driving circuit.

The scan driving circuit of the present invention, by disposing the pull-up control module, can avoid the leakage phenomenon well and improve the reliability of the scan driving circuit, thus solving the technical problem of the conventional scan driving circuit prone to leakage and thus affecting the reliability of the scan driving circuit.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A scan driving circuit for driving a scan line of cascaded stages, comprising:
   a pull-up control module utilized to receive a scanning signal of a previous stage, and to generate a scan level signal of the corresponding scan line according to the scanning signal of the previous stage;
   a pull-up module utilized to lift a scanning signal of a present stage of the corresponding scan line according to the scan level signal and a clock signal of the present stage;
   a pull-down module utilized to lower the scan level signal of the corresponding scan line according to a scanning signal of a next stage;
   a pull-down maintenance module utilized to maintain a low level of the scan level signal of the corresponding scan line;
   a bootstrap capacitor utilized to a high level of the scanning signal of the present stage of the scan line;
   a reset module utilized to reset the scan level signal of the present stage of the scan line; and
   a low-level constant source utilized to provide a pull-down low level;
   wherein the pull-up control module is respectively coupled to the pull-up module, the pull-down module, the pull-down maintenance module, and the bootstrap capacitor; the low-level constant source is respectively coupled to the pull-down maintenance module and the pull-down module;
   wherein the pull-up control module further comprises a first switch, the scanning signal of the previous stage being input to a control terminal of the first switch, the scanning signal of the previous stage being input to an input terminal the first switch, an output terminal of the first switch respectively coupled to the pull-up module, the pull-down module, the pull-down maintain module, and the bootstrap capacitor.

2. The scan driving circuit according to claim 1, wherein the pull-up module comprises a second switch, a control terminal of the second switch coupled to the output terminal of the first switch of the pull-up control module, the clock signal of the present stage being input to an input terminal of the second switch, an output terminal of the second switch outputting the scanning signal of the present stage.

3. The scan driving circuit according to claim 1, wherein the pull-down module comprises a third switch, the scanning signal of the next stage being input to a control terminal of the third switch, an input terminal of the third switch coupled to the output terminal of the first switch of the pull-up control module, an output terminal of the third switch coupled to the low-level constant source.

4. The scan driving circuit according to claim 1, wherein the pull-down maintenance module comprises a first pull-down maintenance unit, a second pull-down maintenance unit, a thirteenth switch, and a fourteenth switch;
a control terminal of the thirteenth switch coupled to the output terminal of the first switch, an output terminal of the thirteenth switch coupled to a reference point K(N), an input terminal of the thirteenth switch coupled to a reference point P(N);
the scanning signal of the previous stage being input to a control terminal of the fourteenth switch, an output terminal of the fourteenth switch coupled to the reference point K(N), an input terminal of the fourteenth switch coupled to the reference point P(N);
the first pull-down maintenance unit comprising a ninth switch, a tenth switch, a sixth switch, an eighth switch, a sixteenth switch;
a control terminal of the tenth switch coupled to the reference point K(N), an input terminal of the tenth switch coupled to the low-level constant source, an output terminal of the tenth switch coupled to the output terminal of the second switch;
a control terminal of the ninth switch coupled to the reference point K(N), an input terminal of the ninth switch coupled to the low-level constant source, an output terminal of the ninth switch coupled to the output terminal of the first switch;
a control terminal of the sixth switch coupled to a first pulse signal, an input terminal of the sixth switch coupled to the first pulse signal, an output terminal of the sixth switch coupled to the reference point K(N);
a control terminal of the sixteenth switch coupled to a second pulse signal, an input terminal of the sixteenth switch coupled to the first pulse signal, an output terminal of the sixteenth switch coupled to the reference point K(N);
a control terminal of the eighth switch coupled to the output terminal of the first switch, an input terminal of the eighth switch coupled to the low-level constant source, an output terminal of the eighth switch coupled to the reference point K(N);
the second pull-down maintenance unit comprising an eleventh switch, a twelfth switch, a fifth switch, a fifteenth switch, and a seventh switch;
a control terminal of the eleventh switch coupled to the reference point P(N), an input terminal of the eleventh switch coupled to the low-level constant source, an output terminal of the eleventh switch coupled to the output terminal of the second switch;
a control terminal of the twelfth switch coupled to the reference point P(N), an input terminal of the twelfth switch coupled to the low-level constant source, an output terminal of the twelfth switch coupled to the output terminal of the first switch;
a control terminal of the fifth switch coupled to the second pulse signal, an input terminal of the fifth switch coupled to the second pulse signal, an output terminal of the fifth switch coupled to the reference point P(N);
a control terminal of the fifteenth switch coupled to the first pulse signal, an input terminal of the fifteenth switch coupled to the second pulse signal, an output terminal of the fifteenth switch coupled to the reference point P(N);
a control terminal of the seventh switch coupled to the output terminal of the first switch, an input terminal of the seventh switch coupled to the low-level constant source, an output terminal of the seventh switch coupled to the reference point K(N).

5. The scan driving circuit according to claim 4, wherein an electric potential of the first pulse signal is opposite to that of the second pulse signal.

6. The scan driving circuit according to claim 4, wherein the first pull-down maintain further comprises an eighteenth switch, the scanning signal of the previous stage being input to a control terminal of the eighteenth switch, an input terminal of the eighteenth switch coupled to the low-level constant source, an output terminal of the eighteenth switch coupled to the reference point K(N);
the second pull-down maintain further comprises an seventeenth switch, the scanning signal of the previous stage being input to a control terminal of the seventeenth switch, an input terminal of the seventeenth switch coupled to the low-level constant source, an output terminal of the seventeenth switch coupled to the reference point P(N).

7. The scan driving circuit according to claim 4, wherein the first pull-down maintain further comprises an eighteenth switch, the scanning signal of the previous stage being input to a control terminal of the eighteenth switch, an input terminal of the eighteenth switch coupled to the low-level constant source, an output terminal of the eighteenth switch coupled to the first pulse signal;
the second pull-down maintain further comprises an seventeenth switch, the scanning signal of the previous stage being input to a control terminal of the seventeenth switch, an input terminal of the seventeenth switch coupled to the low-level constant source, an output terminal of the seventeenth switch coupled to the second pulse signal.

8. The scan driving circuit according to claim 7, wherein the first pull-down maintain further comprises a twentieth switch, a control terminal of the twentieth switch coupled to the reference point K(N), an input terminal of the twentieth switch coupled to the reference point K(N), an output terminal of the twentieth switch coupled to the first pulse signal;
the second pull-down maintain further comprises a nineteenth switch, a control terminal of the nineteenth switch coupled to the reference point K(N), an input terminal of the nineteenth switch coupled to the reference point K(N), an output terminal of the nineteenth switch coupled to the second pulse signal.

9. The scan driving circuit according to claim 4, wherein the first pulse signal and the second pulse signal are high-frequency pulse signals or low-frequency potential signals.

10. A scan driving circuit for driving a plurality of scan lines of cascaded stages, comprising:
a pull-up control module utilized to receive a scanning signal of a previous stage, and to generate a scan level signal of the corresponding scan line according to the scanning signal of the previous stage;
a pull-up module utilized to lift a scanning signal of a present stage of the corresponding scan line according to the scan level signal and a clock signal of the present stage;

a pull-down module utilized to lower the scan level signal of the corresponding scan line according to a scanning signal of a next stage;

a pull-down maintenance module utilized to maintain a low level of the scan level signal of the corresponding scan line;

a bootstrap capacitor utilized to a high level of the scanning signal of the present stage of the scan line; and a low-level constant source utilized to provide a pull-down low level;

wherein the pull-up control module is respectively coupled to the pull-up module, the pull-down module, the pull-down maintenance module, and the bootstrap capacitor; the low-level constant source is respectively coupled to the pull-down maintenance module and the pull-down module.

11. The scan driving circuit according to claim 10, wherein the pull-up control module further comprises a first switch, the scanning signal of the previous stage being input to a control terminal of the first switch, the scanning signal of the previous stage being input to an input terminal the first switch, an output terminal of the first switch respectively coupled to the pull-up module, the pull-down module, the pull-down maintain module, and the bootstrap capacitor.

12. The scan driving circuit according to claim 11, wherein the pull-up module comprises a second switch, a control terminal of the second switch coupled to the output terminal of the first switch of the pull-up control module, the clock signal of the present stage being input to an input terminal of the second switch, an output terminal of the second switch outputting the scanning signal of the present stage.

13. The scan driving circuit according to claim 11, wherein the pull-down module comprises a third switch, the scanning signal of the next stage being input to a control terminal of the third switch, an input terminal of the third switch coupled to the output terminal of the first switch of the pull-up control module, an output terminal of the third switch coupled to the low-level constant source.

14. The scan driving circuit according to claim 11, wherein the pull-down maintenance module comprises a first pull-down maintenance unit, a second pull-down maintenance unit, a thirteenth switch, and a fourteenth switch;

a control terminal of the thirteenth switch coupled to the output terminal of the first switch, an output terminal of the thirteenth switch coupled to a reference point K(N), an input terminal of the thirteenth switch coupled to a reference point P(N);

the scanning signal of the previous stage being input to a control terminal of the fourteenth switch, an output terminal of the fourteenth switch coupled to the reference point K(N), an input terminal of the fourteenth switch coupled to the reference point P(N);

the first pull-down maintenance unit comprising a ninth switch, a tenth switch, a sixth switch, an eighth switch, a sixteenth switch;

a control terminal of the tenth switch coupled to the reference point K(N), an input terminal of the tenth switch coupled to the low-level constant source, an output terminal of the tenth switch coupled to the output terminal of the second switch;

a control terminal of the ninth switch coupled to the reference point K(N), an input terminal of the ninth switch coupled to the low-level constant source, an output terminal of the ninth switch coupled to the output terminal of the first switch;

a control terminal of the sixth switch coupled to a first pulse signal, an input terminal of the sixth switch coupled to the first pulse signal, an output terminal of the sixth switch coupled to the reference point K(N);

a control terminal of the sixteenth switch coupled to a second pulse signal, an input terminal of the sixteenth switch coupled to the first pulse signal, an output terminal of the sixteenth switch coupled to the reference point K(N);

a control terminal of the eighth switch coupled to the output terminal of the first switch, an input terminal of the eighth switch coupled to the low-level constant source, an output terminal of the eighth switch coupled to the reference point K(N);

the second pull-down maintenance unit comprising an eleventh switch, a twelfth switch, a fifth switch, a fifteenth switch, and a seventh switch;

a control terminal of the eleventh switch coupled to the reference point P(N), an input terminal of the eleventh switch coupled to the low-level constant source, an output terminal of the eleventh switch coupled to the output terminal of the second switch;

a control terminal of the twelfth switch coupled to the reference point P(N), an input terminal of the twelfth switch coupled to the low-level constant source, an output terminal of the twelfth switch coupled to the output terminal of the first switch;

a control terminal of the fifth switch coupled to the second pulse signal, an input terminal of the fifth switch coupled to the second pulse signal, an output terminal of the fifth switch coupled to the reference point P(N);

a control terminal of the fifteenth switch coupled to the first pulse signal, an input terminal of the fifteenth switch coupled to the second pulse signal, an output terminal of the fifteenth switch coupled to the reference point P(N);

a control terminal of the seventh switch coupled to the output terminal of the first switch, an input terminal of the seventh switch coupled to the low-level constant source, an output terminal of the seventh switch coupled to the reference point K(N).

15. The scan driving circuit according to claim 14, wherein an electric potential of the first pulse signal is opposite to that of the second pulse signal.

16. The scan driving circuit according to claim 14, wherein the first pull-down maintain further comprises an eighteenth switch, the scanning signal of the previous stage being input to a control terminal of the eighteenth switch, an input terminal of the eighteenth switch coupled to the low-level constant source, an output terminal of the eighteenth switch coupled to the reference point K(N);

the second pull-down maintain further comprises an seventeenth switch, the scanning signal of the previous stage being input to a control terminal of the seventeenth switch, an input terminal of the seventeenth switch coupled to the low-level constant source, an output terminal of the seventeenth switch coupled to the reference point P(N).

17. The scan driving circuit according to claim 14, wherein the first pull-down maintain further comprises an eighteenth switch, the scanning signal of the previous stage being input to a control terminal of the eighteenth switch, an input terminal of the eighteenth switch coupled to the low-level constant source, an output terminal of the eighteenth switch coupled to the first pulse signal;

the second pull-down maintain further comprises an seventeenth switch, the scanning signal of the previous stage being input to a control terminal of the seventeenth switch, an input terminal of the seventeenth switch coupled to the low-level constant source, an output terminal of the seventeenth switch coupled to the second pulse signal.

18. The scan driving circuit according to claim 17, wherein the first pull-down maintain further comprises a twentieth switch, a control terminal of the twentieth switch coupled to the reference point K(N), an input terminal of the twentieth switch coupled to the reference point K(N), an output terminal of the twentieth switch coupled to the first pulse signal;

the second pull-down maintain further comprises a nineteenth switch, a control terminal of the nineteenth switch coupled to the reference point K(N), an input terminal of the nineteenth switch coupled to the reference point K(N), an output terminal of the nineteenth switch coupled to the second pulse signal.

19. The scan driving circuit according to claim 14, wherein the first pulse signal and the second pulse signal are high-frequency pulse signals or low-frequency potential signals.

20. The scan driving circuit according to claim 10, wherein the scan driving circuit further comprises:
a reset module utilized to reset the scan level signal of the present stage of the scan line.

* * * * *